United States Patent
Basu et al.

(10) Patent No.: US 9,768,340 B2
(45) Date of Patent: Sep. 19, 2017

(54) PHOTODIODE WITH A DARK CURRENT SUPPRESSION JUNCTION

(71) Applicant: Texas Instruments Incorporated, Dallas, TX (US)

(72) Inventors: Debarshi Basu, Dallas, TX (US); Henry Litzmann Edwards, Garland, TX (US); Dimitar Trifonov Trifonov, Vail, AZ (US); Josh Du, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/552,995

(22) Filed: Nov. 25, 2014

(65) Prior Publication Data

US 2015/0145097 A1    May 28, 2015

Related U.S. Application Data

(60) Provisional application No. 61/908,304, filed on Nov. 25, 2013.

(51) Int. Cl.
*H01L 31/101* (2006.01)
*H01L 31/11* (2006.01)

(52) U.S. Cl.
CPC .............................. *H01L 31/1105* (2013.01)

(58) Field of Classification Search
CPC . H01L 31/1105; H01L 31/18; H01L 31/02005
See application file for complete search history.

(56) References Cited

U.S. PATENT DOCUMENTS

| | | | | |
|---|---|---|---|---|
| 5,162,887 A | * | 11/1992 | Dierschke | H01L 31/103 257/463 |
| 5,416,345 A | * | 5/1995 | Matsunaga | H01L 27/14831 257/222 |
| 6,437,415 B1 | | 8/2002 | Kuhara et al. | |
| 8,742,523 B2 | | 6/2014 | Edwards et al. | |
| 2009/0302309 A1 | * | 12/2009 | Razeghi | H01L 27/14649 257/21 |
| 2010/0308213 A1 | * | 12/2010 | Romero | H01L 27/14609 250/216 |

\* cited by examiner

*Primary Examiner* — Trung Q Dang
*Assistant Examiner* — Wasiul Haider
(74) *Attorney, Agent, or Firm* — Jacqueline J. Garner; Charles A. Brill; Frank D. Cimino

(57) ABSTRACT

This invention relates to field photodiodes based on PN junctions that suffer from dark current leakage. An NBL is added to prove a second PN junction with the anode. The second PN junction is reversed biased in order to remove dark current leakage. The present solution requires no additional masks or thin films steps relative to a conventional CMOS process flow.

13 Claims, 3 Drawing Sheets

PHOTODIODE WITH A DARK CURRENT SUPPRESSION JUNCTION

CROSS-REFERENCE TO RELATED APPLICATIONS

This application claims the benefit of priority under U.S.C. §119(e) of U.S. Provisional Application 61/908,304 (Texas Instruments docket number TI-74240PS), filed Nov. 25, 2013 the contents of which are hereby incorporated by reference.

FIELD OF THE INVENTION

This invention relates to the field of photodiodes based on PN junctions. More particularly, this invention relates to field photodiodes based on PN junctions that suffer from dark current leakage.

BACKGROUND OF THE INVENTION

Photodiodes based on PN junctions suffer from dark current, which is essentially the normal PN junction reverse bias leakage current that will be detected in the absence of a light signal (See, FIG. 1). The dark current must be subtracted from the photodiode signal in order to sense the light signal intensity accurately. This sets the low-light limit of sensitivity of a photosensor product, particularly at high temperature where PN junction leakage is the highest.

Most photodiode processes use a single junction. In such a configuration, the dark current is the same as the reverse-bias leakage current of a simple pn junction diode. Specifically, the pn junction collects minority carriers that are thermally excited within a diffusion length of the junction.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit and method are provided to reduce the problem of sensitivity of photodiodes to the presence of dark current, comprising: producing a change in its current voltage characteristics, by providing a plurality of p-n junctions, such that photocurrent is extracted from at least one n-type cathode while the remaining n-type cathodes are held at positive voltage to act as collectors to reduce the minority carrier concentration in the anode to below the value typical of thermal equilibrium. Under these conditions, the dark current can be reduced by up to an order of magnitude relative to a simple single pn junction photodiode or up to two orders of magnitude relative to a more complex photodiode comprising multiple pn junctions, some of which are grounded.

DESCRIPTION OF THE VIEWS OF THE DRAWING

In the drawings, like reference numerals are sometimes used to designate like structural elements. It should also be appreciated that the depictions in the figures are diagrammatic and not to scale.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An improved photodiode may be formed with no additional masks or thin films steps relative to the baseline process flow. It applies to any CMOS-based process flow such as smart power, bipolar/CMOS/DMOS (BCD), or CMOS technology node.

Figure 1:
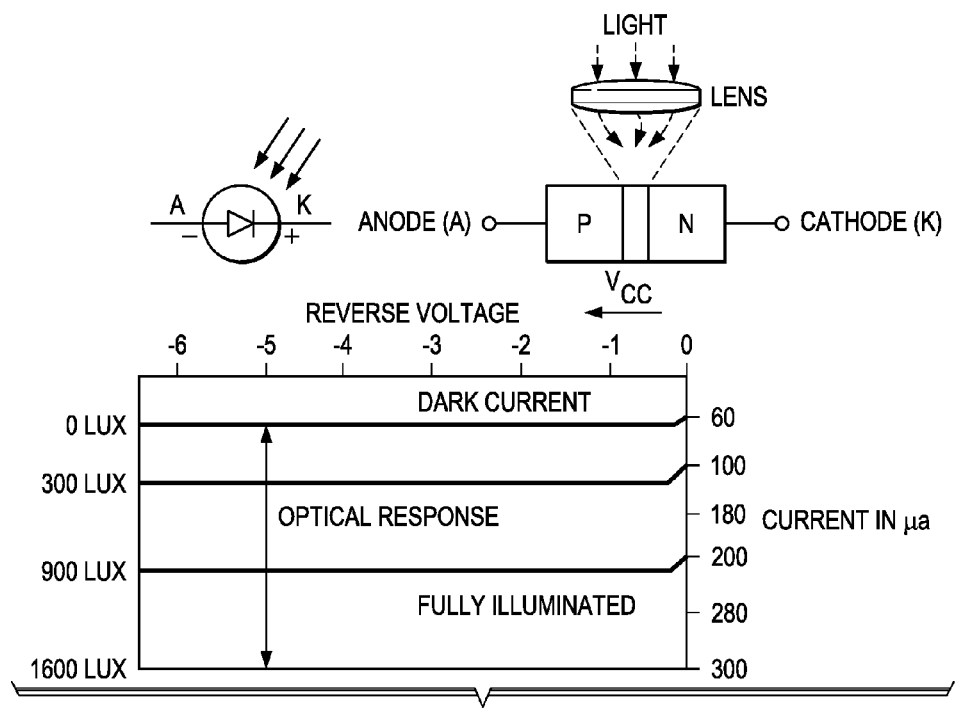
FIG. 1 Illustrates typical photodiodes and their expected current outputs
Figure 2:
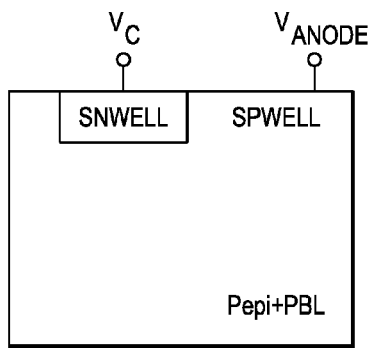
FIG. 2 shows a cross-section of a conventional photodiode.
Figure 3:
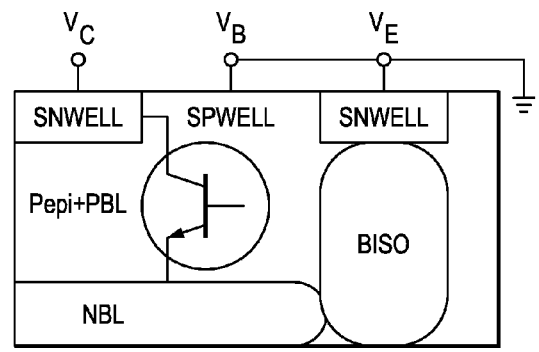
FIG. 3 shows a cross-section of a photodiode having an NBL shield grounded to the anode.

In the prior art photodiode of FIG. 2 (Case 1), a P-N junction comprises an N-type well SNWELL diffusion into a P-type epitaxial layer. In the photodiode of FIG. 3 (Case 2), an n-type buried layer NBL is added below the cathode $V_C$ generating an NPN or bipolar structure. Connection to the NBL is made through a second SNWELL and an n-type diffused region BISO. The emitter $V_E$ is grounded to the SPWELL.

Figure 4:
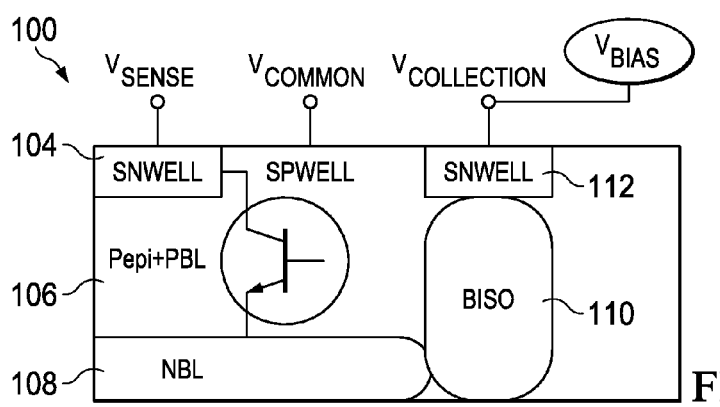
FIG. 4 shows a cross-section of a photodiode with dark current suppression according to an embodiment of this invention.

A photodiode 100 according to a first example photodiode is shown in FIG. 4 (Case 3). $V_{SENSE}$ is connected to a first SNWELL 104 that forms the sensing cathode of the device. $V_{COMMON}$ is connected to the SPWELL/$P_{epi}$+PBL 106 that forms the base or anode of the device. $V_{COLLECTION}$ is connected to a collection cathode that includes second SNWELL 112, BISO 110, and the NBL 108. $V_{COLLECTION}$ is also connected to a reversed bias voltage connection $V_{BIAS}$. The reversed bias voltage connection provides a reverse bias voltage between the base/anode region 106 and the collection cathode). FIG. 4 represents the addition of a P-N junction to the existing P-N junction photodiode, thus generating an NPN or bipolar structure (similar to FIG. 3). The secondary P-N junction is formed by adding the n-type buried layer NBL 108. In contrast to the photodiode of FIG.

3, the secondary P-N junction of FIG. 4 is reverse biased to reduce the dark current flowing through the first P-N junction.

The current equation of the Cathode without NBL shield leakage (Case 1—Prior Art) is:

$$I_{C,n,1} = \frac{qAD_n}{L_n} n_p$$

The equation for a shielded SNWELL with a grounded NBL (Case 2, Prior Art) is:

$$I_{E,n} = I_{C,n} = \frac{qAD_n}{W_B} n_p$$

$$\frac{I_{C,n}(\text{case 2})}{I_{C,n}(\text{case 1})} = \frac{L_n}{W_B}$$

Leakage measured = 56 pA at 90 C.

The photodiode in FIG. 4 employs a primary P-N junction comprising of an N-type well SNWELL diffusion 104 into a P-type epitaxial layer 106. The secondary P-N junction is implemented by an n-type buried NBL layer 108 included below the SNWELL cathode forming an NPN structure.

By appropriately reverse biasing the P-epi 106 to NBL 108 junction the dark current in the SNWELL 104 to P-epi 106 junction can be reduced by 2 orders of magnitude relative to the case of grounding the NBL to the p-epi (Case 2), or by one order of magnitude relative to the prior art single pn junction photodiode (Case 1).

The reduction in dark current can be explained in a Shielded SNWELL, Reverse biased NBL shield. This emitter being physically remote from the cathode, makes the two pn junctions independent of each other. Comparing to an ideal diode leakage, it can be seen that the cathode leakage here has a ratio of Ln/WB where WB is the un-depleted base-width, and Ln is the diffusion length of electrons. (Ln>WB) Adding Isolation is needed for gain scaling, improved linearity, but grounding it (as in Case 2) increases leakage by 10×.

The equation for a Shielded SNWELL, FIG. 4, reverse biased NBL shield is (Case 3):

$$I_{E,n} \approx -\frac{qAD_n}{L_n} n_p \frac{W_B}{2L_n}$$

$$I_{C,n} = \frac{qAD_n}{L_n} n_p \frac{W_B}{2L_n} = I_{C,n,2}\left(\frac{W_B^2}{2L_n^2}\right)$$

In the case of the Shielded SNWELL, reverse-biased NBL shield FIG. 4, by reverse biasing the isolation, the sensing cathode is "shielded" from minority carrier generation in the anode and the collection cathode is reversed biased. Higher reverse bias reduces volume of material and hence reduces leakage.

Summary: Comparison of the Biasing Scheme and Resulting Current Equations:
Case 1 (Prior Art): Unshielded SNWELL Cathode $$I_{C,n,1} = \frac{qAD_n}{L_n} n_p$$

Case 2 (Prior Art): NBL-Shielded Cathode, Grounded Emitter $$I_{C,n,2} = \frac{qAD_n}{W_B} n_p = I_{C,n,1}\left(\frac{L_n}{W_B}\right) > I_{C,n,1}$$

Case 3 (First Embodiment): NBL-Shielded Cathode, Reverse Biased Emitter $$I_{C,n,3} = \frac{qAD_n}{L_n} n_p \frac{W_B}{2L_n} = I_{C,n,2}\left(\frac{1}{2}\right)\left(\frac{W_B}{L_n}\right)^2 \ll I_{C,n,2}$$

Since it is possible to build an anode such that WB is much less than Ln (for example 10×), the present example constructed according to case 3 will have 100× lower dark current than a prior art photodiode constructed according to case 2 and 10× less dark current than the prior art single pn junction photodiode constructed according to case 1.

Figure 5:
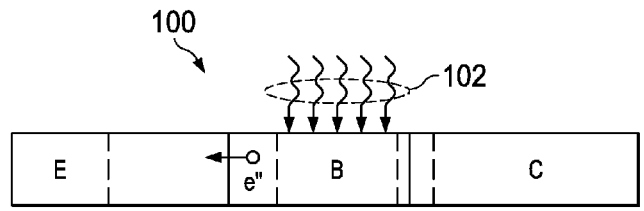
FIG. 5 shows a cross-section of FIG. 4 detailing the construction of the photodiode with dark current suppression according to an embodiment if this invention.

FIG. 5 shows a conceptual view of the NPN structure 100, with photons 102 illuminating the active region B and creating photoelectrons e". In reality the photon illumination comes in from the surface of the silicon, so the photoelectrons are created in the SNWELL collector/cathode, the pepi base/anode B, the NBL emitter/shield, and the first epi/psub region. The "most important" photoelectrons are those produced in the SNWELL and pepi since all the rest are collected by the NBL and taken away from the signal path (which goes between anode pepi and cathode SNWELL) through the emitter E.

In practice, a diode which is used in an application to interact with optical illumination by producing a change in its current voltage characteristics is a photodiode.

A photodiode may contain a plurality of nested p-n junctions in which the p-n junctions can be biased independently thus forming an isolated photodiode.

An isolated photodiode in which the top/primary p-n junction is reverse biased while the bottom/secondary p-n junction is connected to a current amplifier produces a measurement of the photoelectrons produced deep below the surface of the silicon, with up to 10× less dark current than if the top junction alone is used in a prior art configuration.

Figure 6:
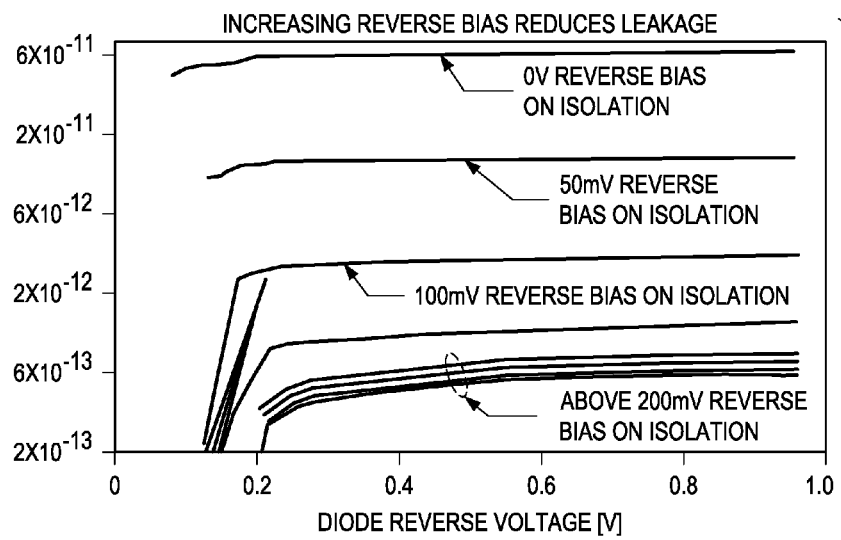
FIG. 6 illustrates the effects of temperature and biasing schemes on the disclosed invention according to an embodiment if this invention.
Figure 6:
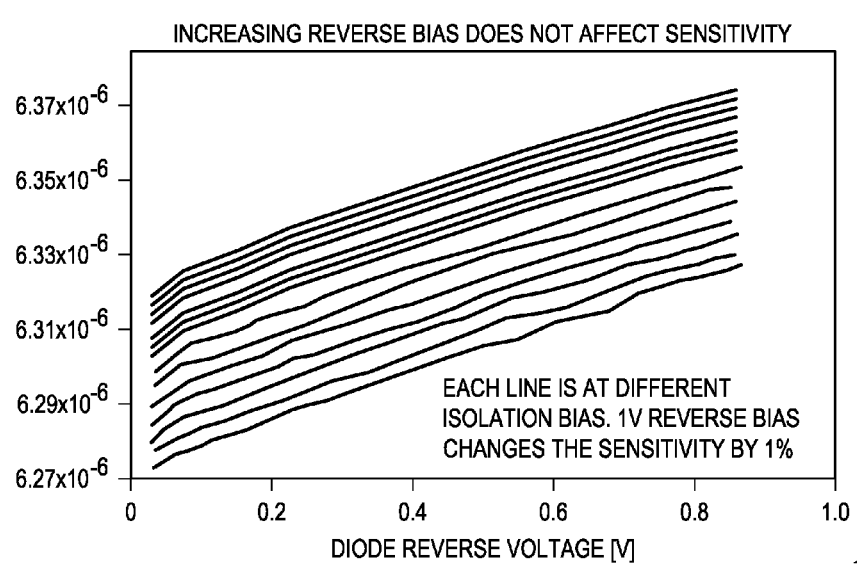

An isolated photodiode exhibits reduced dark photocurrent in the top/primary p-n junction when the bottom/secondary p-n junction is strongly reverse biased and photocurrent is collected from the top pn junction. FIG. 6 illustrates the effects of temperature and biasing schemes on the disclosed structure of FIG. 4. As FIG. 6 indicates, increasing the reverse bias voltage reduces leakage.

Figure 7:
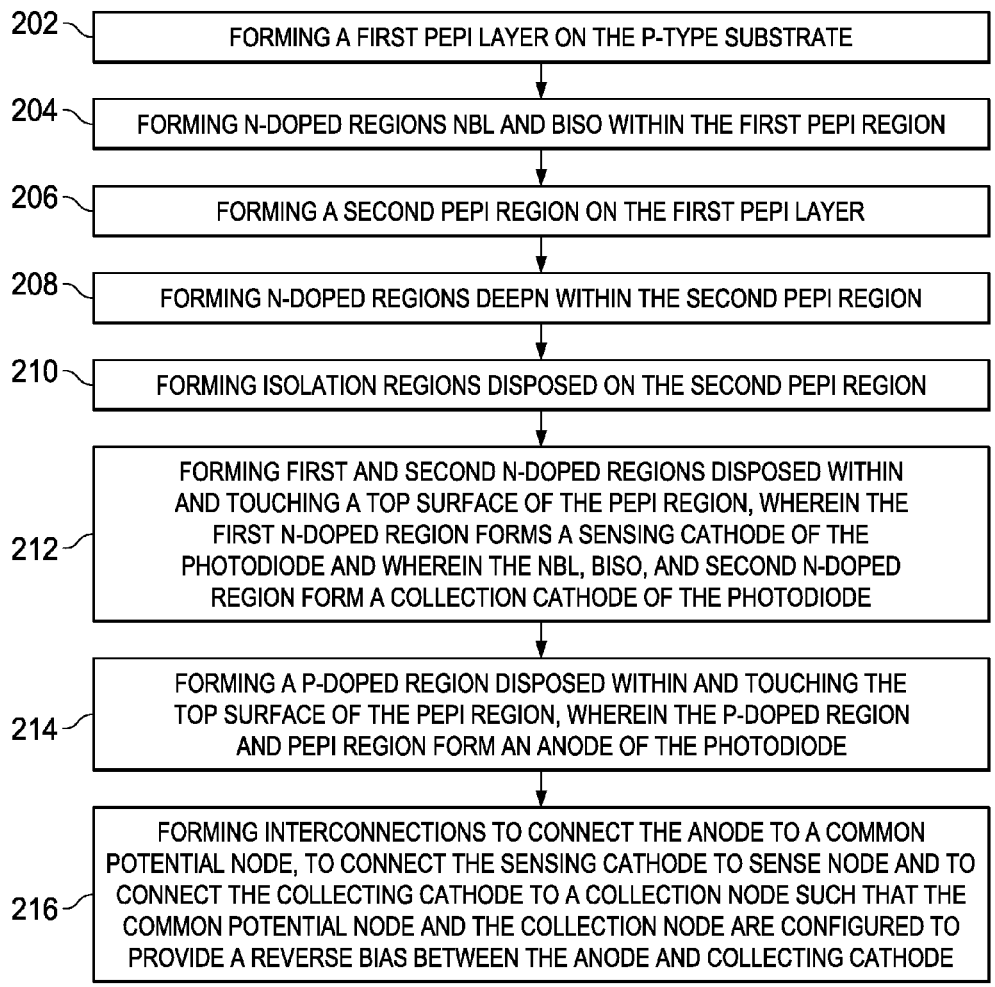
FIG. 7 is a process flow diagram for forming a photodiode such as the photodiode of FIG. 4.

FIG. 7 is a process flow diagram of a method that may be used to fabricate the photodiode of FIG. 4. The photodiode may be formed in a p-type substrate. In Step 202, a first p-type epitaxial (PEPI) layer is formed on the p-type substrate. Then, n-doped regions NBL and BISO are formed within the first PEPI region in Step 204. In step 206, a second PEPI region may be formed on the first PEPI layer. Then, n-doped regions DEEPN are formed within the second PEPI region in Step 208. DEEPN region extend from the surface of the second PEPI region to the NBL region. In step 210, isolation regions may be disposed on the second PEPI region. In step 212, first and second n-doped regions are formed within and touching a top surface of the second PEPI region. The first n-doped region forms a sensing cathode of the photodiode and the NBL, BISO, and second n-doped region form a collection cathode of the photodiode.

A p-doped region is disposed within and touching the top surface of the PEPI region between the first and second n-doped regions in Step 214. The p-doped region and PEPI region form an anode of the photodiode. In Step 216, interconnections are formed to connect the anode to a common potential node, to connect the sensing cathode to sense node and to connect the collecting cathode to a collection node. The common potential node and the collection node are configured to provide a reverse bias between the anode and collecting cathode.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit including a photodiode, comprising
    a p-type semiconductor substrate;
    an anode comprising a region of p-type semiconductor material disposed within said p-type semiconductor substrate;
    a sensing cathode comprising a region of n-type semiconductor material disposed within said p-type semiconductor substrate, further disposed such that the sensing cathode forms a first pn junction with the anode, the region of n-type semiconductor material connected to a sense terminal;
    an n-type buried layer (NBL) located below the sensing cathode and spaced from the sensing cathode by the anode, such that the anode and the NBL form a second pn junction;
    a collection cathode comprising a region of n-type semiconductor material disposed within said p-type semiconductor substrate, further disposed such that the collection cathode forms a pn junction with the anode; and
    a reverse bias voltage connection to the collection cathode, such that the collection cathode collects and removes minority carrier electrons that are thermally generated within said anode, thus reducing the dark current contribution to the photocurrent signal sensed from the sensing cathode.

2. The integrated circuit of claim 1, wherein said collection cathode is so disposed as to enclose said anode and said sensing cathode.

3. The integrated circuit of claim 2, wherein said collection cathode includes at least one of BISO, DEEPN, or NBL doping.

4. The integrated circuit of claim 1, wherein said sensing cathode includes shallow well SNWELL doping.

5. The integrated circuit of claim 1, wherein the sensing cathode includes n-type source-drain doping NSD.

6. The integrated circuit of claim 1, wherein the collection cathode includes shallow well SNWELL doping.

7. The integrated circuit of claim 1, wherein the collection cathode includes n-type source-drain doping NSD.

8. The integrated circuit of claim 1, wherein the collection cathode includes at least one of BISO, DEEPN, or NBL doping.

9. The integrated circuit of claim 1, wherein the anode includes p-type epitaxially deposited silicon PEPI.

10. The integrated circuit of claim 1, wherein the anode includes shallow well SPWELL doping.

11. The integrated circuit of claim 1, wherein the anode includes p-type source-drain doping PSD.

12. The integrated circuit of claim 1, wherein the reverse bias connection is configured to provide a reverse bias of greater than 100mV between the collection cathode and the anode.

13. A photodiode, comprising
    a p-type semiconductor substrate;
    an anode comprising a region of p-type semiconductor material disposed within said p-type semiconductor substrate;
    a sensing cathode comprising a first well region of n-type semiconductor material disposed within said p-type semiconductor substrate, further disposed such that the sensing cathode forms a first pn junction with the anode;
    a collection cathode spaced from the sensing cathode by the anode, such that the anode and the collection cathode form a second pn junction, wherein the collection cathode comprises an n-type buried layer (NBL) located below the sensing cathode and spaced from the sensing cathode by the anode, a second well region of n-type semiconductor material within the p-type semiconductor substrate; and a n-type region located between and contacting both the second well region and the NBL;
    a sense terminal connected to the sensing cathode;
    a common terminal connected to the anode;
    a collection terminal connected to the collection cathode; and
    a reverse bias voltage connection to the collection cathode.

* * * * *